United States Patent
Xu et al.

(10) Patent No.: US 11,329,038 B2
(45) Date of Patent: May 10, 2022

(54) DISPLAY DEVICE AND ELECTRONIC EQUIPMENT

(71) Applicant: BOE TECHNOLOGY GROUP CO., LTD., Beijing (CN)

(72) Inventors: Pan Xu, Beijing (CN); Yicheng Lin, Beijing (CN); Ling Wang, Beijing (CN); Guoying Wang, Beijing (CN); Xing Zhang, Beijing (CN); Ying Han, Beijing (CN); Dongfang Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/253,537

(22) PCT Filed: May 15, 2020

(86) PCT No.: PCT/CN2020/090510
§ 371 (c)(1),
(2) Date: Dec. 17, 2020

(87) PCT Pub. No.: WO2020/253427
PCT Pub. Date: Dec. 24, 2020

(65) Prior Publication Data
US 2021/0193642 A1    Jun. 24, 2021

(30) Foreign Application Priority Data
Jun. 21, 2019    (CN) .......................... 201910542997.6

(51) Int. Cl.
*H05K 1/14* (2006.01)
*H05K 1/18* (2006.01)
(Continued)

(52) U.S. Cl.
CPC .......... *H01L 25/18* (2013.01); *H01L 27/3276* (2013.01); *H05K 1/189* (2013.01);
(Continued)

(58) Field of Classification Search
CPC . H01L 25/18; H01L 27/3276; H01L 23/3171; H01L 23/49513; H01L 25/10;
(Continued)

(56) References Cited

U.S. PATENT DOCUMENTS

2008/0117376 A1    5/2008   Takenaka
2010/0245299 A1*   9/2010   Han ..................... G02F 1/13452
                                                           345/204
(Continued)

FOREIGN PATENT DOCUMENTS

CN    101187735 A    5/2008
CN    204855999 U    12/2015
(Continued)

*Primary Examiner* — Xiaoliang Chen
(74) *Attorney, Agent, or Firm* — Muncy, Geissler, Olds & Lowe, P.C.

(57) ABSTRACT

The present disclosure provides a display device, including: a display panel, a main circuit board, and a plurality of chip-on-films bonded between the display panel and the main circuit board. The wiring area is provided with a plurality of first binding regions; the plurality of first binding regions are distributed along the wiring area. The main circuit board is provided with a plurality of second binding regions which are corresponding to the first binding regions in a one-to-one manner. A shape of the main circuit board is the same as a shape of the wiring area. A first end of each chip-on-film is bonded to one corresponding first binding region; a second end of each chip-on-film is bonded to one corresponding second binding region.

20 Claims, 3 Drawing Sheets

(51) Int. Cl.
- *H05K 5/00* (2006.01)
- *H05K 5/03* (2006.01)
- *H01L 25/10* (2006.01)
- *H01L 27/12* (2006.01)
- *G02F 1/133* (2006.01)
- *G02F 1/1333* (2006.01)
- *G04G 17/04* (2006.01)
- *G04G 17/06* (2006.01)
- *H01L 25/18* (2006.01)
- *H01L 27/32* (2006.01)

(52) U.S. Cl.
CPC ............ *H05K 2201/1053* (2013.01); *H05K 2201/10128* (2013.01); *H05K 2201/10962* (2013.01)

(58) Field of Classification Search
CPC .............. H01L 27/12; H05K 1/189; H05K 2201/10128; H05K 2201/1053; H05K 2201/10962; H05K 1/148; H05K 3/361; H05K 5/00; H05K 5/0017; H05K 5/03; G09F 9/33; G02F 1/133; G02F 1/1333; G02F 1/1362; G02F 1/13452; G02F 1/13306; G02F 1/136286; G04G 17/04; G04G 17/045; G04G 17/06
USPC ................................. 361/783; 345/175, 204
See application file for complete search history.

(56) References Cited

U.S. PATENT DOCUMENTS

| | | | |
|---|---|---|---|
| 2013/0087770 A1 | 4/2013 | Son et al. | |
| 2015/0169011 A1* | 6/2015 | Bibl | H01L 23/3171 |
| | | | 345/175 |
| 2017/0123252 A1* | 5/2017 | Chen | G02F 1/13306 |
| 2017/0168463 A1* | 6/2017 | Hong | H05K 1/148 |
| 2017/0169786 A1 | 6/2017 | Huang | |
| 2017/0309644 A1* | 10/2017 | Yeh | G02F 1/1362 |
| 2018/0047657 A1* | 2/2018 | Li | H01L 23/49513 |
| 2019/0215976 A1* | 7/2019 | Choi | H01L 51/524 |
| 2019/0302511 A1* | 10/2019 | Qing | H05K 1/189 |
| 2020/0091273 A1* | 3/2020 | Lee | H01L 27/3237 |

FOREIGN PATENT DOCUMENTS

| | | |
|---|---|---|
| CN | 105242427 A | 1/2016 |
| CN | 105374333 A | 3/2016 |
| CN | 105529338 A | 4/2016 |
| CN | 105931572 A | 9/2016 |
| CN | 205788905 U | 12/2016 |
| CN | 107808863 A | 3/2018 |
| CN | 108369360 A | 8/2018 |
| CN | 110265445 A | 9/2019 |
| EP | 2337434 A1 | 6/2011 |

\* cited by examiner

DISPLAY DEVICE AND ELECTRONIC EQUIPMENT

CROSS-REFERENCE TO RELATED APPLICATIONS

This application is the U.S. national phase of PCT Application No. PCT/CN2020/090510 filed on May 15, 2020, which claims the benefit and priority of Chinese Application No. 201910542997.6, filed on Jun. 21, 2019, which are incorporated herein by reference in their entirety.

TECHNICAL FIELD

The present disclosure relates to the field of manufacturing display products, and in particular to a display device and an electronic equipment.

BACKGROUND

Display devices are currently being used in more and more industries, some of which require display devices that are different from conventional square or rectangular display devices, such as circular watch screens, letter screens and notch screens of mobile phones appearing in the market. A shape of a display area can be realized by special-shaped design software. At present, a driver circuit (IC) used in a periphery of a special-shaped screen generally still adopts the chip-on-film (COF) bonding solution. However, the peripheral bonding design and the bonding solution in the related are difficult to meet the narrow border requirements of large-size special-shaped display devices.

SUMMARY

Embodiments of the present disclosure provide a display device, including: a display panel, a main circuit board, and a plurality of chip-on-films bonded between the display panel and the main circuit board;

wherein the display panel includes an effective displaying area and a wiring area located in a periphery around the effective displaying area; the wiring area is provided with a plurality of first binding regions; the plurality of first binding regions are distributed along the wiring area;

the main circuit board is provided with a plurality of second binding regions which are corresponding to the first binding regions in a one-to-one manner; a shape of the main circuit board is the same as a shape of the wiring area;

a first end of each chip-on-film is bonded to one corresponding first binding region; a second end of each chip-on-film is bonded to one corresponding second binding region.

Optionally, the first binding region is disposed in parallel with the corresponding second binding region.

Optionally, a distance between each of the first binding regions and the corresponding second binding region is identical.

Optionally, the first binding regions are evenly arranged in the wiring area.

Optionally, the display panel has a special-shape other than a rectangle; the first bonding regions are arranged along the wiring area according to the shape of the display panel.

Optionally, the display panel has a shape of circle, and a center line of each first binding region in a direction from the main circuit board to the display panel passes through a center of the circle.

Optionally, the first binding region is located on a display surface of the display panel; the main circuit board is located on a back surface of the display panel; the back surface is opposite to the display surface; the first end of each chip-on-film is located on the display surface of the display panel; the second end of each chip-on-film is located on the back surface of the display panel.

Optionally, the first binding regions and the main circuit board are both located on a back surface of the display panel; the first binding regions are located in the wiring area at the back surface of the display panel.

Optionally, the display panel is circular; the wiring area is a ring surrounding the effective displaying area; the first binding regions are arranged at intervals along a periphery of the wiring area.

Optionally, the first binding regions are arranged at intervals along a circumference of a first circle.

Optionally, the second binding regions are arranged at intervals along a circumference of a second circle; the first circle and the second circle are arranged concentrically, and diameters of the first circle and the second circle are different.

Optionally, the wiring area surrounds the main circuit board.

Optionally, the first binding regions are located on a back surface of the display panel; the back surface is opposite to a light-emitting surface of the display panel;

the second end of each chip-on-film and the main circuit board are stacked on the back surface of the display panel.

The present disclosure further provides an electronic equipment, including the above display device.

DETAILED DESCRIPTION

In order to make the objects, the technical solutions and the advantages of the embodiments of the present disclosure more apparent, the technical solutions of the embodiments of the present disclosure will be described hereinafter in a clear and complete manner in conjunction with the drawings of the embodiments of the present disclosure. Apparently, the described embodiments are merely a part of, rather than all of, the embodiments of the present disclosure, and based on these described embodiments of the present disclosure, a person skilled in the art may obtain other embodiments, which also fall within the scope of the present disclosure.

Figure 1:
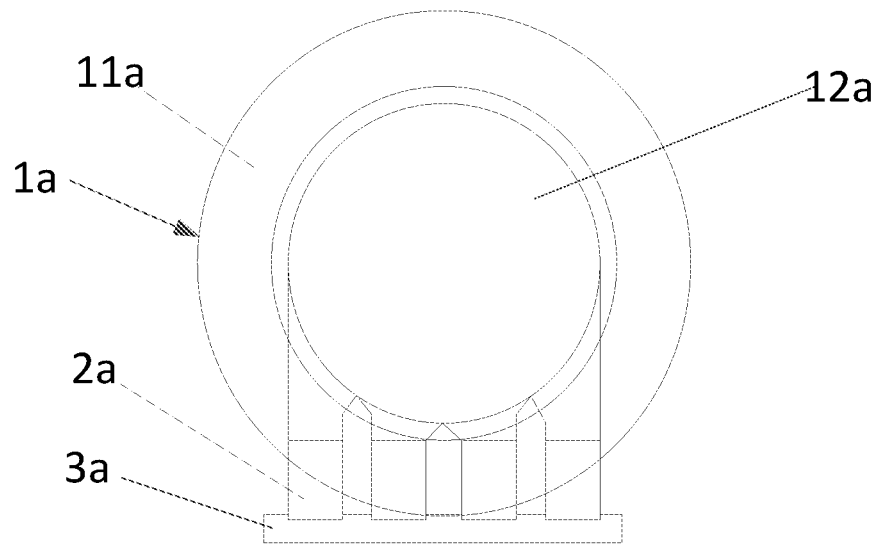
FIG. 1 is a schematic diagram of a single-side bonding state of a chip-on-film in the related art.
Figure 2:
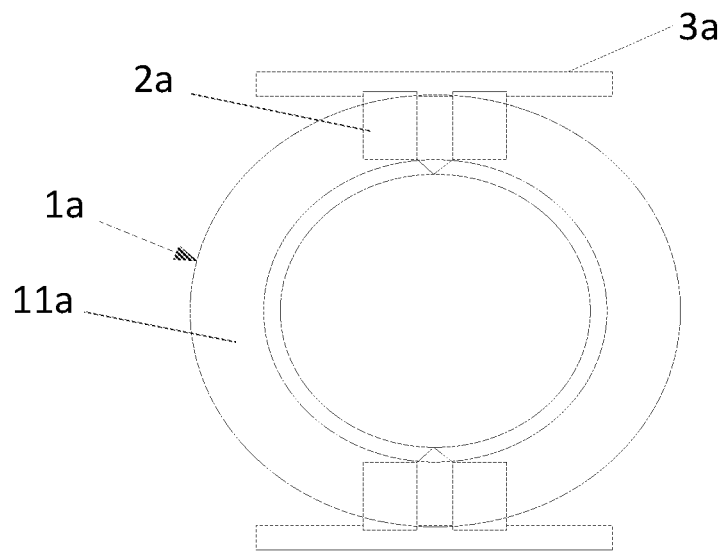
FIG. 2 is a schematic diagram of a double-sided bonding state of a chip-on-film in the related art.

A driver circuit (IC) used in a periphery of a special-shaped screen generally still adopts the chip-on-film (COF) bonding solution. Most of gate sides adopt the gate driver on array (GOA) solution to achieve special-shaped arrangement, but a driver IC at a source side has to adopt the COF bonding solution. If several ICs (COF) are used for driving, the bonding solution in the related art will result in a larger border, which is incompatible with narrow border requirements of current display devices. Therefore, the current special-shaped screen almost uses one IC (COF) for driving to achieve the narrow border. However, large-size special-shaped display devices have gradually attracted attention from the market. The large-size special-shaped display device, particularly a large-size active-matrix organic light-emitting diode (AMOLED) display device, requires more COF ICs for driving. However, a bonding solution with several COFs for the special-shaped display screen has rarely appeared. According to the design and bonding solution in the related art, the border of the display screen will be extremely large and cannot meet the visual requirements of persons. For example, FIG. 1 and FIG. 2 show two bonding manners (single-sided and double-sided bonding). The bonding scheme in the related art requires that a bonding area on a main circuit board 3a and a bonding area on a display panel 1a are in a straight line, and most PCBs are designed to have a standard rectangular or square shape. Then, this requires that the bonding area outside an AA area (effective displaying area 12a) has a long bonding area that cannot be used to achieve special shape. But, the AA area is special-shaped, and a border 11a also needs to be special-shaped, and thus a very large border 11a has to be reserved to realize the bonding setting of several chip-on-films 2a.

Figure 3:
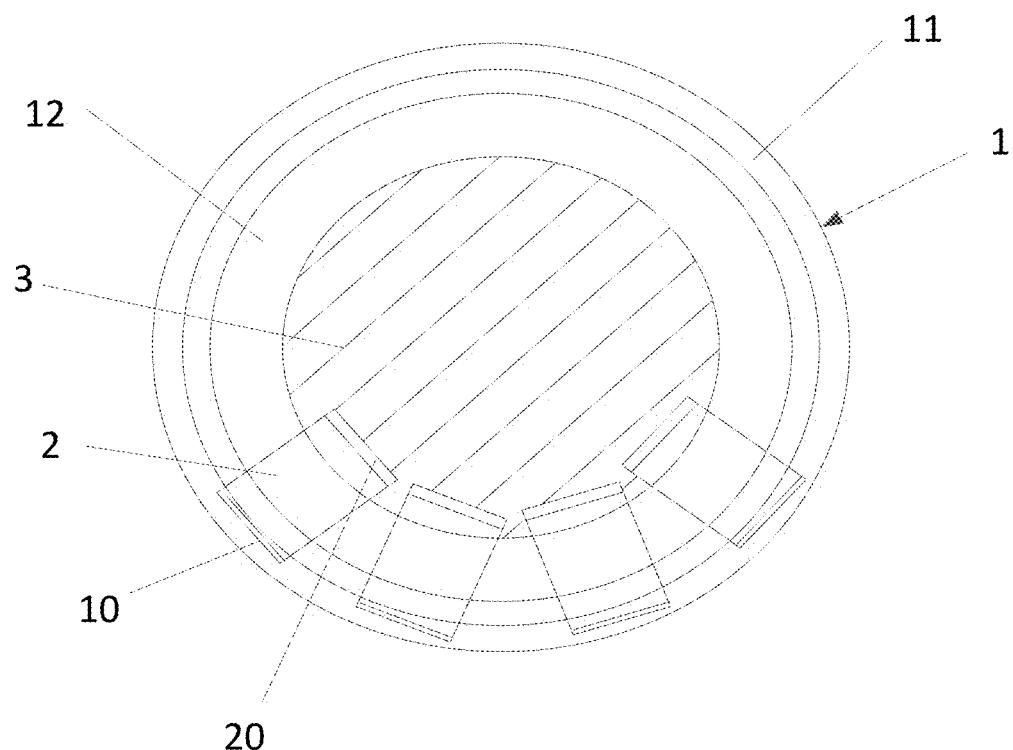
FIG. 3 is a schematic diagram showing settings of a first binding region according to an example of one embodiment.
Figure 4:
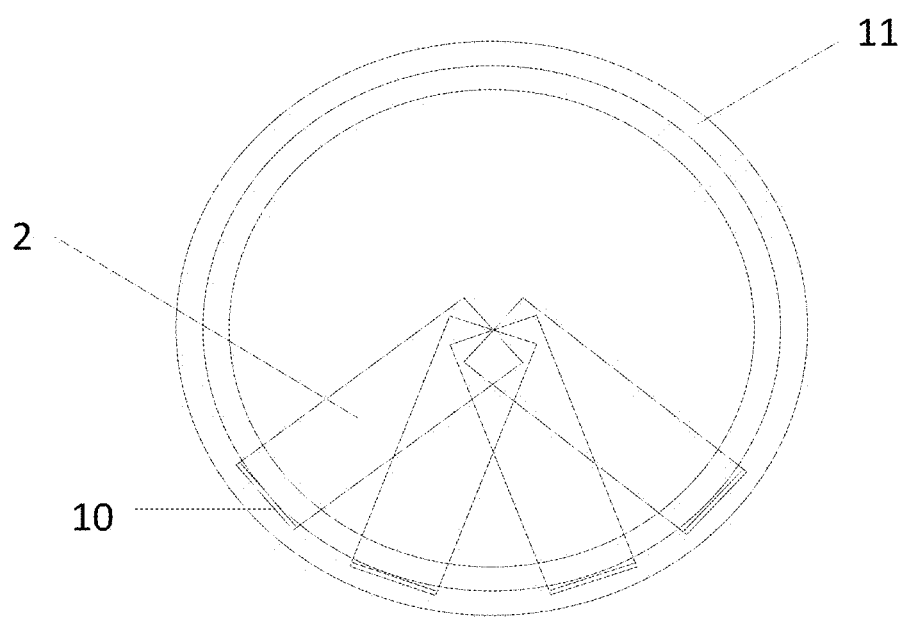
FIG. 4 is a schematic diagram of a bonding state of a chip-on-film according to an example of one embodiment.

In view of the above problems, as shown in FIG. 3 and FIG. 4, one embodiment provides a display device, including a display panel 1, a main circuit board 3, and a plurality of chip-on-films 2 bonded between the display panel 1 and the main circuit board 3.

The display panel 1 includes an effective displaying area 12 and a wiring area 11 located in a periphery around the effective displaying area 12. The wiring area 11 is provided with a plurality of first binding regions 10. The plurality of first binding regions 10 are distributed along the wiring area 11.

The main circuit board 3 is provided with a plurality of second binding regions 20 which are corresponding to the first binding regions 10 in a one-to-one manner. A shape of the main circuit board 3 is the same as the shape of the wiring area.

A first end of each chip-on-film 2 is bonded to a corresponding first binding region 10. A second end of each chip-on-film 2 is bonded to a corresponding second binding region 20.

Figure 7:
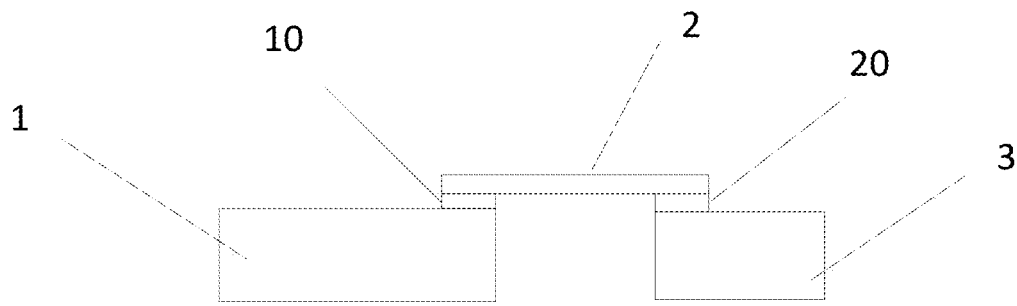
FIG. 7 is a first schematic diagram showing a state in which a chip-on-film is connected with a display panel and a main circuit board according to an example of one embodiment.
Figure 8:
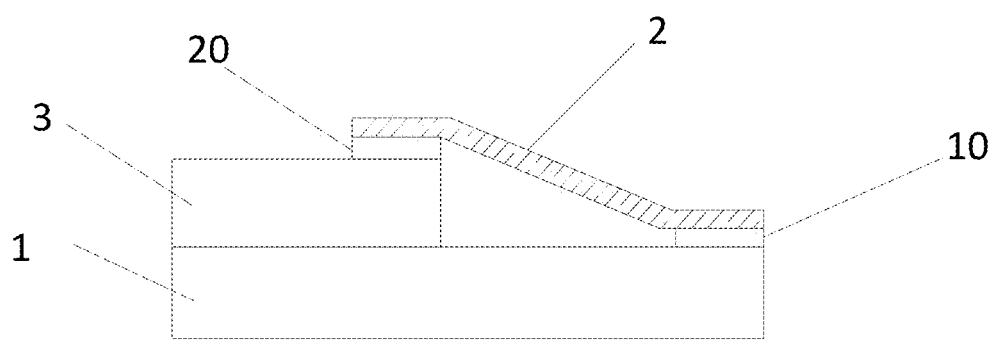
FIG. 8 is a second schematic diagram showing a state in which a chip-on-film is connected with a display panel and a main circuit board according to an example of one embodiment.

The shape of the main circuit board 3 is the same as the shape of the wiring area 11 of the display panel 1, or the shape of the main circuit board 3 is the same as a shape of the effective displaying area 12 of the display panel 1. For example, the effective displaying area 12 of the display panel 1 is circular and the wiring area 11 is located at the periphery of the effective displaying area 12, then the wiring area 11 is annular. For the top emission display screen (i.e., a top emission display device as shown in FIG. 7), after the chip-on-film 2 is bonded to the display panel 1 through the first binding region 10 and is bound to the main circuit board 3 through the second binding region 20, the chip-on-film 2 is bent such that the main circuit board 3 is located behind the display panel 1. At this point, the shape of the main circuit board 3 is the same as the shape of the wiring area 11 of the display panel 1; that is, the shape of the main circuit board 3 is annular. For the bottom emission display screen (i.e., a bottom emission display device as shown in FIG. 8), the chip-on-film 2 is bonded to the display panel 1 through the first binding region 10 and is bound to the main circuit board 3 through the second binding region 20, and the main circuit board 3 is located on one surface of the display panel 1 opposite to a light emitting surface of the display panel 1, and the main circuit board 3 is located inside the first binding region 10. At this point, the shape of the main circuit board 3 is the same as the shape of the effective displaying area 12 of the display panel 1.

The wiring area 11 is provided with the first binding regions 10, the main circuit board 3 is provided with the second binding regions 20 that are corresponding to the first binding regions 10 in a one-to-one manner, and the chip-on-films 2 are bonded through the first binding regions 10 and the second binding regions 20. In other words, several chip-on-films 2 are arranged along the wiring area according to the shape of the wiring area. Compared with the bonding arrangement of the chip-on-film 2a in the related art, arrangement of several chip-on-films 2 can be realized while achieving a narrow border. The bonding method of the chip-on-film 2 in this embodiment can be applied to small-size display products as well as large-size display products.

Figure 5:
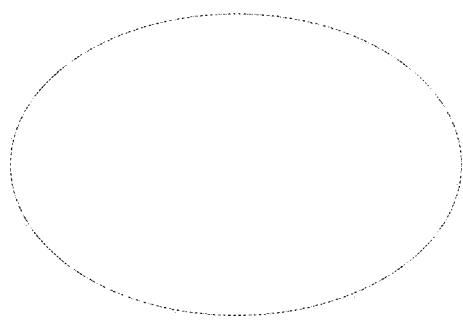
FIG. 5 is a first schematic diagram showing a shape of a display panel according to an example of one embodiment.
Figure 6:
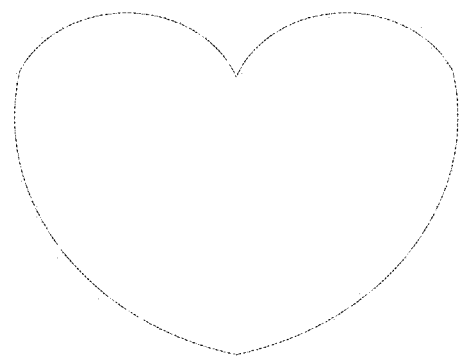
FIG. 6 is a second schematic diagram showing a shape of a display panel according to an example of one embodiment.

The shape of the display panel 1 may be a regular or irregular geometric shape. The bonding method of the chip-on-film 2 in this embodiment is particularly suitable for the special-shaped display panel 1. In this embodiment, the shape of the display panel 1 may be a special shape other than a rectangle, such as a circle, an arc, a heart shape, an ellipse or a fan shape. FIG. 5 shows an elliptical display panel. FIG. 6 shows a heart-shaped display panel. Several first binding regions 10 are arranged along the wiring area according to the shape of the display panel 1.

It should be noted that, in general, a shape of the effective displaying area of the display panel 1 is the same as an overall shape of the display panel 1.

The setting of the first binding regions 10 may be specifically determined according to the shape of the wiring area 11 of the display panel 1 and an area of the wiring area at a corresponding position of (or a length of a side of the wiring area at a corresponding position on the display panel 1).

In an example of the present embodiment, the display panel 1 has a shape of circle (i.e., the effective displaying area 12 is circular, and the wiring area 11 is a ring surrounding the periphery of the effective displaying area 11), and a center line of each first binding region 10 in a direction from the main circuit board 3 to the display panel 1 passes through the center of the circle, as shown in FIG. 3.

In another example of the present embodiment, the display panel 1 is in a fan shape (i.e., the effective displaying area 12 is in a fan shape, and the wiring area 11 is a ring shape surrounding the periphery of the effective displaying area 11), and in a direction from an edge of the display panel 1 to an inside of the display panel 1, a center line of the first binding region 10 disposed at a corresponding a linear side of the fan shape is perpendicular to the corresponding linear side of the fan shape, and the first binding region 10 disposed at a corresponding arc side of the fan shape may be set according to a curvature of the arc side.

It should be noted that the number of the first binding regions 10 may be specifically set according to actual needs.

In this embodiment, the first binding region 10 is disposed in parallel with the corresponding second binding region 20.

The second binding regions 20 are disposed in a one-to-one correspondence with the first binding regions 10, and the first binding region 10 is disposed in parallel with the corresponding second binding region 20, thereby facilitate binding of the chip-on-films 2.

In this embodiment, a distance between each of the first binding regions 10 and the corresponding second binding region 20 is identical.

The distance between each of the first binding regions 10 and the corresponding second binding region 20 is identical, which ensures uniformity of the type of the chip-on-films 2 on the same display panel 1 and facilitates bonding of the chip-on-films 2.

In this embodiment, a plurality of the first binding regions 10 are evenly arranged in the wiring area.

In an example of the present embodiment, for the top emission screen which is a display screen that emits light upward, as shown in FIG. 7, the first binding region 10 is located at an edge of a display surface of the display panel 1. The chip-on-film 2 is reversely bent such that the main circuit board 3 is located behind the display panel 1. FIG. 7 is a schematic diagram showing a state in which the chip-on-film 2 is not folded.

In another example of the present embodiment, for the bottom emission screen which is a display screen that emits light downward, as shown in FIG. 8, the first binding region 10 and the main circuit board 3 are both located on a back surface of the display panel 1 (i.e., one surface opposite to the light emitting surface of the display panel 1). The first binding region 10 is located at an edge of the back surface of the display panel 1, as shown in FIG. 8.

The display device may be any product or component having a display function, such as a liquid crystal television, a liquid crystal display device, a digital photo frame, a mobile phone, a tablet computer. The display device further includes a flexible circuit board, a printed circuit board, and a backboard.

One embodiment further provides an electronic equipment including the above display device.

It should be noted that the embodiments in this specification are described in a progressive manner. The same or similar parts between the embodiments can be referred to each other. Each embodiment focuses on differences from other embodiments. In particular, for the method embodiments, since they are basically similar to the product embodiments and thus the description thereof is relatively simple, and the relevant parts can be referred to the description of the product embodiments.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Such words as "comprises" or "include" mean that an element or object appearing before the word covers elements or objects listed after the word and their equivalents, but do not exclude other elements or objects. Similarly, such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

It will be understood that when an element such as a layer, film, region, or substrate is referred to as being "on" or "under" another element, this element may be "directly" on or "under" the other element, or, there may be an intermediate element therebetween.

In the description of the above embodiments, specific features, structures, materials or characteristics may be combined in any suitable manner in any one or more embodiments or examples.

The above are merely the embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. The protection scope of the present disclosure shall be subject to the protection scope of the claims.

What is claimed is:

1. A display device, comprising:
   a display panel;
   a main circuit board; and
   a plurality of chip-on-films bonded between the display panel and the main circuit board;
   wherein the display panel includes an effective displaying area and a wiring area located in a periphery around the effective displaying area; the wiring area is provided with a plurality of first binding regions; the plurality of first binding regions are distributed along the wiring area,
   wherein the main circuit board is provided with a plurality of second binding regions which are corresponding to the first binding regions in a one-to-one manner; a shape of the main circuit board is the same as a shape of the wiring area,
   wherein a first end of each chip-on-film is bonded to one corresponding first binding region; a second end of each chip-on-film is bonded to one corresponding second binding region, and
   wherein the shape of the main circuit board is an annular ring and the main circuit board surrounds the effective displaying area.

2. The display device according to claim 1, wherein the first binding region is disposed in parallel with the corresponding second binding region.

3. The display device according to claim 1, wherein a distance between each of the first binding regions and the corresponding second binding region is identical.

4. The display device according to claim 1, wherein the first binding regions are evenly arranged in the wiring area.

5. The display device according to claim 4, wherein the display panel has a special-shape other than a rectangle; the first bonding regions are arranged along the wiring area according to the shape of the display panel.

6. The display device according to claim 5, wherein the display panel has a shape of circle, and a center line of each first binding region in a direction from the main circuit board to the display panel passes through a center of the circle.

7. The display device according to claim 1, wherein the first binding region is located on a display surface of the display panel; the main circuit board is located on a back surface of the display panel; the back surface is opposite to the display surface; the first end of each chip-on-film is located on the display surface of the display panel; the second end of each chip-on-film is located on the back surface of the display panel.

8. The display device according to claim 1, wherein the first binding regions and the main circuit board are both located on a back surface of the display panel; the first binding regions are located in the wiring area at the back surface of the display panel.

9. The display device according to claim 1, wherein the display panel is circular; the wiring area is a ring surrounding the effective displaying area; the first binding regions are arranged at intervals along a periphery of the wiring area.

10. The display device according to claim 9, wherein the first binding regions are arranged at intervals along a circumference of a first circle.

11. The display device according to claim 10, wherein the second binding regions are arranged at intervals along a circumference of a second circle; the first circle and the second circle are arranged concentrically, and diameters of the first circle and the second circle are different.

12. The display device according to claim 9, wherein the wiring area surrounds the main circuit board.

13. The display device according to claim 12, wherein the first binding regions are located on a back surface of the display panel; the back surface is opposite to a light-emitting surface of the display panel;
the second end of each chip-on-film and the main circuit board are stacked on the back surface of the display panel.

14. An electronic equipment, comprising:
a display device comprising:
a display panel;
a main circuit board; and
a plurality of chip-on-films bonded between the display panel and the main circuit board,
wherein the display panel includes an effective displaying area and a wiring area located in a periphery around the effective displaying area; the wiring area is provided with a plurality of first binding regions; the plurality of first binding regions are distributed along the wiring area,
wherein the main circuit board is provided with a plurality of second binding regions which are corresponding to the first binding regions in a one-to-one manner; a shape of the main circuit board is the same as a shape of the wiring area,
wherein a first end of each chip-on-film is bonded to one corresponding first binding region; a second end of each chip-on-film is bonded to one corresponding second binding region, and
wherein the shape of the main circuit board is an annular ring; and the main circuit board surrounds the effective displaying area.

15. The electronic equipment according to claim 14, wherein the first binding region is disposed in parallel with the corresponding second binding region.

16. The electronic equipment according to claim 14, wherein a distance between each of the first binding regions and the corresponding second binding region is identical.

17. The electronic equipment according to claim 14, wherein the first binding regions are evenly arranged in the wiring area.

18. The electronic equipment according to claim 17, wherein the display panel has a special-shape other than a rectangle; the first bonding regions are arranged along the wiring area according to the shape of the display panel.

19. The electronic equipment according to claim 18, wherein the display panel has a shape of circle, and a center line of each first binding region in a direction from the main circuit board to the display panel passes through a center of the circle.

20. The electronic equipment according to claim 14, wherein the first binding region is located on a display surface of the display panel; the main circuit board is located on a back surface of the display panel; the back surface is opposite to the display surface; the first end of each chip-on-film is located on the display surface of the display panel; the second end of each chip-on-film is located on the back surface of the display panel.

\* \* \* \* \*